(12) United States Patent
Song et al.

(10) Patent No.: US 10,769,791 B2
(45) Date of Patent: Sep. 8, 2020

(54) SYSTEMS AND METHODS FOR CROSS-MODALITY IMAGE SEGMENTATION

(71) Applicant: BEIJING KEYA MEDICAL TECHNOLOGY CO., LTD., Beijing (CN)

(72) Inventors: Qi Song, Seattle, WA (US); Shanhui Sun, Princeton, NJ (US); Youbing Yin, Kenmore, WA (US); Kunlin Cao, Kenmore, WA (US)

(73) Assignee: BEIJING KEYA MEDICAL TECHNOLOGY CO., LTD., Beijing (CN)

( * ) Notice: Subject to any disclaimer, the term of this patent is extended or adjusted under 35 U.S.C. 154(b) by 148 days.

(21) Appl. No.: 16/138,926

(22) Filed: Sep. 21, 2018

(65) Prior Publication Data

US 2019/0114773 A1    Apr. 18, 2019

Related U.S. Application Data

(60) Provisional application No. 62/572,061, filed on Oct. 13, 2017.

(51) Int. Cl.
*G06K 9/00*    (2006.01)
*G06T 7/10*    (2017.01)
(Continued)

(52) U.S. Cl.
CPC ............ *G06T 7/10* (2017.01); *G01R 33/4812* (2013.01); *G01R 33/5608* (2013.01);
(Continued)

(58) Field of Classification Search
CPC ........ G06N 3/0454; G06N 3/08; G06N 20/00; G06T 2207/20081; G06T 7/0012;
(Continued)

(56) References Cited

U.S. PATENT DOCUMENTS 9,968,257 B1 *  5/2018  Burt ..................... A61B 5/7267
2017/0293736 A1 * 10/2017  Kramer ................. G16H 50/70
(Continued)

OTHER PUBLICATIONS

Nam, Hyeonseob, and Bohyung Han. "Learning multi-domain convolutional neural networks for visual tracking." Proceedings of the IEEE conference on computer vision and pattern recognition. 2016. (Year: 2016).*

(Continued)

*Primary Examiner* — Li Liu
(74) *Attorney, Agent, or Firm* — Bayes PLLC (57) ABSTRACT

Embodiments of the disclosure provide systems and methods for segmenting a medical image. The system includes a communication interface configured to receive the medical image acquired by an image acquisition device. The system also includes a memory configured to store a plurality of learning networks jointly trained using first training images of a first imaging modality and second training images of a second imaging modality. The system further includes a processor, configured to segment the medical image using a segmentation network selected from the plurality of learning networks.

20 Claims, 7 Drawing Sheets (51) Int. Cl.
| | |
|---|---|
| *G01R 33/48* | (2006.01) |
| *G06T 7/00* | (2017.01) |
| *G06T 7/11* | (2017.01) |
| *G06K 9/62* | (2006.01) |
| *G01R 33/56* | (2006.01) |

(52) U.S. Cl.
CPC ........... *G06K 9/629* (2013.01); *G06K 9/6271* (2013.01); *G06T 7/0012* (2013.01); *G06T 7/11* (2017.01); *G06K 2209/05* (2013.01); *G06T 2207/10081* (2013.01); *G06T 2207/10088* (2013.01); *G06T 2207/10104* (2013.01); *G06T 2207/10108* (2013.01); *G06T 2207/10116* (2013.01); *G06T 2207/10132* (2013.01); *G06T 2207/20081* (2013.01)

(58) Field of Classification Search
CPC . G06T 2207/20084; G06T 2207/30004; G06T 7/10; G06T 2207/10081; G06T 2207/10088; A61B 5/7267; A61B 6/5247; A61B 8/5261; G06K 2209/05
See application file for complete search history.

(56) References Cited

U.S. PATENT DOCUMENTS

| | | | | |
|---|---|---|---|---|
| 2017/0330068 | A1* | 11/2017 | Yu | G06K 9/6274 |
| 2017/0330319 | A1* | 11/2017 | Xu | G06T 7/0012 |
| 2017/0337682 | A1* | 11/2017 | Liao | G06T 7/30 |
| 2018/0276825 | A1* | 9/2018 | Dai | G06T 7/11 |
| 2019/0018933 | A1* | 1/2019 | Oono | G06N 3/0472 |
| 2019/0066281 | A1* | 2/2019 | Zheng | G06N 3/08 |
| 2019/0205606 | A1* | 7/2019 | Zhou | G06K 9/0014 |

OTHER PUBLICATIONS

Tseng, Kuan-Lun, et al. "Joint sequence learning and cross-modality convolution for 3d biomedical segmentation." Proceedings of the IEEE conference on Computer Vision and Pattern Recognition. 2017. (Year: 2017).*

Wu, Ancong, et al. "RGB-infrared cross-modality person re-identification." Proceedings of the IEEE international conference on computer vision. 2017. (Year: 2017).*

Lin, Liang, et al. "Cross-domain visual matching via generalized similarity measure and feature learning." IEEE transactions on pattern analysis and machine intelligence 2017. (Year: 2017).*

Havaei, Mohammad, et al. "Hemis: Hetero-modal image segmentation." International Conference on Medical Image Computing and Computer-Assisted Intervention. Springer, Cham, 2016. (Year: 2016).*

First Office action issued in related Chinese Application No. 201811188083.6, dated May 19, 2020, 6 pages.

"Learning Multi-Domain Convolutional Networks for Visual Tracking", Hyeonseob Nam et al. 2016 IEEE Conference on Computer Vision and Pattern Recognition, 10 pages.

* cited by examiner

SYSTEMS AND METHODS FOR CROSS-MODALITY IMAGE SEGMENTATION

CROSS REFERENCE TO RELATED APPLICATION

The present application is based on and claims the benefits of priority to U.S. Provisional Application No. 62/572,061, filed Oct. 13, 2017, which is incorporated herein by reference in its entirety.

TECHNICAL FIELD

The present disclosure relates to systems and methods for medical image segmentation, and more particularly to, systems and methods for cross-modality image segmentation using a learning network trained with multi-modality images.

BACKGROUND

Accurate segmentation of medical images is a key step in contouring during radiotherapy planning. Image segmentation is the process of partitioning a digital image into multiple segments. The goal of segmentation is to simplify and/or change the representation of an image into something that is more meaningful and easier to analyze. Image segmentation is typically used to locate objects and boundaries (lines, curves, etc.) in images. More precisely, image segmentation is the process of assigning a label to every pixel in an image such that pixels with the same label share certain characteristics. Image segmentation has been used for various applications, including locating tumors and other pathologies, measuring tissue volumes, diagnosis and study of anatomical structure, surgery planning, virtual surgery simulation, and intra-surgery navigation.

Image segmentation may be solved as a classification problem. Learning networks, such as Convolutional Neural Network (CNN) with powerful hierarchical architectures, have been applied to image segmentation to improve accuracy. For example, automatic classifications using CNN could significantly outperform conventional image segmentation methods, such as atlas-based segmentation, and shape-based segmentation.

Different medical imaging modalities have been used for obtaining medical images. For example, Computed topography (CT) and Magnetic resonance (MR) imaging are the most widely used radiographic techniques in diagnosis, clinical studies and treatment planning. Each imaging modality has its own advantages and disadvantages. For example, MRI is good at imaging soft tissue and showing tissue difference between normal and abnormal. For example, MRI is generally more sensitive in detecting brain abnormalities during the early stages of disease, and is particularly useful in detecting white matter disease, such as multiple sclerosis, progressive multifocal leukoencephalopathy, leukodystrophy, and post-infectious encephalitis. However, CT is good at imaging bone, lungs and blood vessels with contrast agent.

Due to the strengths of different imaging modalities, multi-modality image segmentation provides improved accuracy because fusion of different modalities could provide complimentary information.

Embodiments of the disclosure address the above problems by systems and methods for segmenting a single modality image using a learning network that leverages multi-modality information during training stage.

SUMMARY

Embodiments of the disclosure provide a system for segmenting a medical image. The system includes a communication interface configured to receive the medical image acquired by an image acquisition device. The system also includes a memory configured to store a plurality of learning networks jointly trained using first training images of a first imaging modality and second training images of a second imaging modality. The system further includes a processor, configured to segment the medical image using a segmentation network selected from the plurality of learning networks.

Embodiments of the disclosure also provide a method for segmenting a medical image. The method includes receiving the medical image acquired by an image acquisition device. The method further includes receiving, from a training device, a plurality of learning networks jointly trained using first training images of a first imaging modality and second training images of a second imaging modality. The method also includes segmenting, by a processor, the medical image using a segmentation network selected from the plurality of learning networks.

Embodiments of the disclosure further provide a non-transitory computer-readable medium having instructions stored thereon that, when executed by one or more processors, causes the one or more processors to perform a method for segmenting a medical image. The method includes receiving the medical image acquired by an image acquisition device. The method further includes receiving a plurality of learning networks jointly trained using first training images of a first imaging modality and second training images of a second imaging modality. The method also includes segmenting the medical image using a segmentation network selected from the plurality of learning networks.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Figure 1:
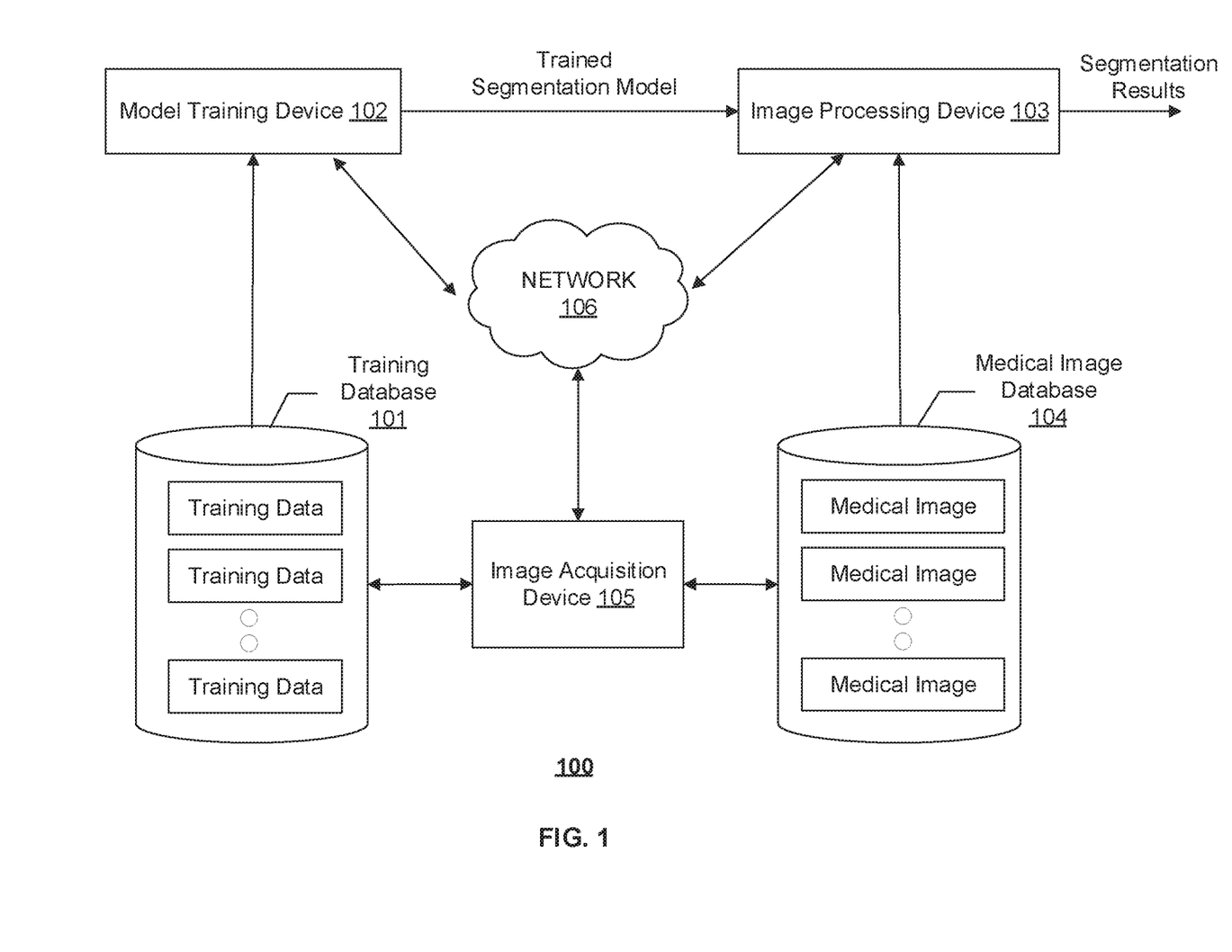
FIG. 1 illustrates a schematic diagram of an exemplary image segmentation system, according to embodiments of the disclosure.

FIG. 1 illustrates an exemplary image segmentation system 100, according to some embodiments of the present disclosure. Consistent with the present disclosure, image segmentation system 100 is configured to segment a medical image acquired by an image acquisition device 105. In some embodiments, image acquisition device 105 includes an MRI scanner (not shown) and a CT scanner (not shown).

The MRI scanner includes a magnet that surrounds a patient tube with a magnetic field. A patient is positioned on a padded table that can move into the patient tube. The MRI scanner further includes gradient coils in multiple directions (e.g., x, y, and z directions) to create a spatially varying magnetic field on top of the uniform magnetic field created by the magnet. The uniform magnetic field used by the MRI scanner are typically between 0.2 T-7 T, e.g., around 1.5 T or 3 T. The MRI scanner also includes RF coils to excite the tissues inside the patient body and transceivers to receive electromagnetic signals generated by the tissues while returning to an equilibrium state.

The CT scanner includes an X-ray source that emits X-rays against body tissues and a receiver that receives the residual X-rays after attenuated by the body tissues. The CT scanner also includes rotating mechanism to capture X-ray images at different view angles. Such rotating mechanism can be a rotating table that rotates the patient, or a rotating structure that rotates the X-ray source and the receiver around the patient. The X-ray images at different angles are then processed by a computer system to construct a two-dimensional (2D) cross section image or a three-dimensional (3D) image.

Although the descriptions are made using MRI and CT images as an example, it is contemplated that the disclosed systems and methods are not limited to segmenting MRI and/or CT images, but may also be applied or adapted to process images acquired using various other imaging modalities, including, e.g., functional MRI (e.g., fMRI, DCE-MRI and diffusion MRI), Cone Beam CT (CBCT), Positron Emission Tomography (PET), Single-Photon Emission Computed Tomography (SPECT) , X-ray, optical tomography, fluorescence imaging, ultrasound imaging, and radiotherapy portal imaging, etc.

As shown in FIG. 1, image segmentation system 100 may include components for performing two stages, a training stage and a detection stage. To perform the training stage, image segmentation system 100 may include a training database 101 and a model training device 102. To perform the detection stage, image segmentation system 100 may include an image processing device 103 and a medical image database 104. In some embodiments, image segmentation system 100 may include more or less of the components shown in FIG. 1. For example, when a segmentation network for segmenting the medical images is pre-trained and provided, image segmentation system 100 may include only image processing device 103 and medical image database 104.

Image segmentation system 100 may optionally include a network 106 to facilitate the communication among the various components of image segmentation system 100, such as databases 101 and 104, devices 102, 103, and 105. For example, network 106 may be a local area network (LAN), a wireless network, a cloud computing environment (e.g., software as a service, platform as a service, infrastructure as a service), a client-server, a wide area network (WAN), etc. In some embodiments, network 106 may be replaced by wired data communication systems or devices.

In some embodiments, the various components of image segmentation system 100 may be remote from each other or in different locations, and be connected through network 106 as shown in FIG. 1. In some alternative embodiments, certain components of image segmentation system 100 may be located on the same site or inside one device. For example, training database 101 may be located on-site with or be part of model training device 102. As another example, model training device 102 and image processing device 103 may be inside the same computer or processing device.

As shown in FIG. 1, model training device 102 may communicate with training database 101 to receive one or more sets of training data. Each set of training data may include a medical image and its corresponding ground truth label map that provides the segmentation result to each of the pixels of the image. Training images stored in training database 101 may be obtained from a medical image database containing previously acquired medical images. In some embodiments, training images in training database 101 includes multi-modality training images acquired by different image acquisition systems of a same part of a patient, such as MRI training images and CT training images acquired by an MRI scanner and a CT scanner. As a result, each MRI training image has a corresponding CT training image in training database 101. The training images can be 2-D or 3-D images. The training images are previously segmented with each pixel/voxel classified and labeled, e.g., with value 1 if the pixel/voxel corresponds to an object of interest (e.g. cancer) or value 0 if the pixel/voxel corresponds to background (e.g. non-cancer).

Model training device 102 may use the training data received from training database 101 to train a segmentation model for segmenting a medical image received from, e.g., medical image database 104. Model training device 102 may be implemented with hardware specially programmed by software that performs the training process. For example, model training device 102 may include a processor and a non-transitory computer-readable medium. The processor may conduct the training by performing instructions of a training process stored in the computer-readable medium. Model training device 102 may additionally include input and output interfaces to communicate with training database 101, network 106, and/or a user interface (not shown). The user interface may be used for selecting sets of training data, adjusting one or more parameters of the training process, selecting or modifying a framework of the learning network, and/or manually or semi-automatically providing detection results associated with an image for training.

Consistent with some embodiments, the segmentation network may be a machine learning network such as a CNN or an FCN. However, it is contemplated that the structure of the network is not limited to any network architecture. The segmentation network may be trained using supervised learning. The architecture of the segmentation model includes a stack of distinct layers that transform the input into the output. Examples of the different layers may include one or more convolution layers or fully-convolutional layers, non-linear operator layers, pooling or subsampling layers, fully connected layers, and/or final loss layers. Each layer may connect one upstream layer and one downstream layer.

As used herein, "training" a learning network refers to determining one or more parameters of at least one layer in the learning network. For example, a convolutional layer of a CNN model may include at least one filter or kernel. One or more parameters, such as kernel weights, size, shape, and structure, of the at least one filter may be determined by e.g., a backpropagation-based training process.

Consistent with the present disclosure, the FCN model may be trained directly by model training device 102 using the training data or transformed from a trained CNN model. In some embodiments, the convolutional layers in a CNN model may be transformed to fully-convolutional layers in an FCN model. Unlike a CNN model that can only process an input of a set size, an FCN model can process input of an arbitrary size. Therefore, the FCN model may offer more flexibility than the CNN model for image processing device 103. Using an FCN transformed from a CNN (e.g., Inception V3), the resulting probability map will be the same as using the more powerful CNN architecture itself except that the latter uses a larger stride. Transformation between a CNN model and an FCN model is described in U.S. application Ser. No. 16/049,809 entitled "Systems and Methods for Detecting Cancer Metastasis using a Neural Network" and filed Jul. 31, 2018, which is incorporated by reference in its entirety.

Consistent with the present disclosure, model training device 102 jointly trains a cross-modality learning network, a first-modality segmentation network, and a second-modality segmentation network, using the multi-modality training images from training database 101. The jointly trained segmentation networks carry information from both first imaging modality (e.g., MRI) and second imaging modality (e.g., CT). Therefore, even if later used to segment a single-modality image, the segmentation networks can leverage cross-modality information to aid the segmentation.

Figure 3A:
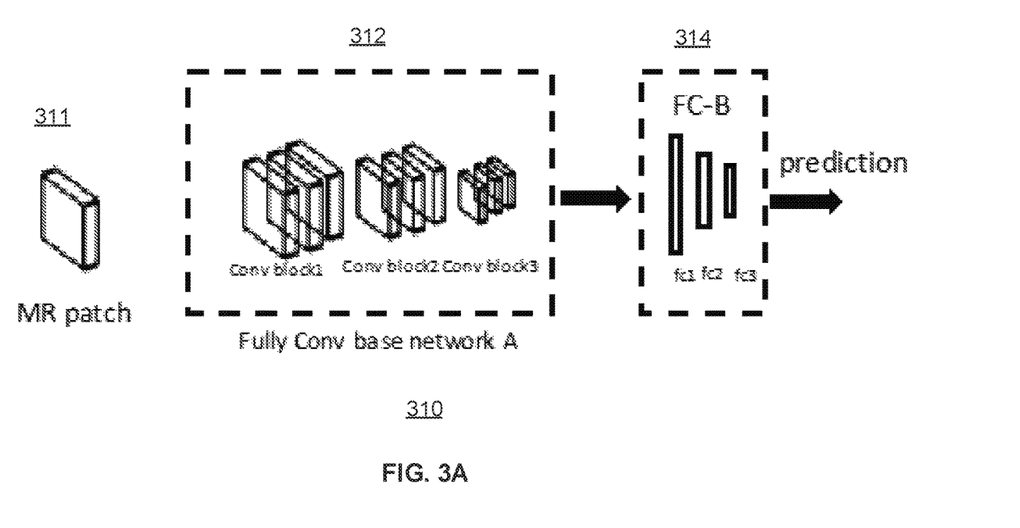
FIG. 3A illustrates an exemplary first-modality learning network for segmenting first-modality images, according to embodiments of the disclosure.

For example, FIG. 3A illustrates an exemplary first-modality learning network for segmenting first-modality images, according to embodiments of the disclosure, and FIG. 3B illustrates an exemplary second-modality learning network for segmenting second-modality images, according to embodiments of the disclosure. In some embodiments, as shown by FIG. 3A, the first-modality learning network may be an MRI segmentation network 310, which includes, among others, a fully convolutional base network A 312, and a fully connected network FC-B 314. MRI segmentation network 310 receives MRI image patches 311 as its input and output predication/segmentation results, e.g., labels for the pixels/voxels of MRI image patches 311. FC-B 314 further includes multiple fully connected layers, such as fc1, fc2, and fc3.

Figure 3B:
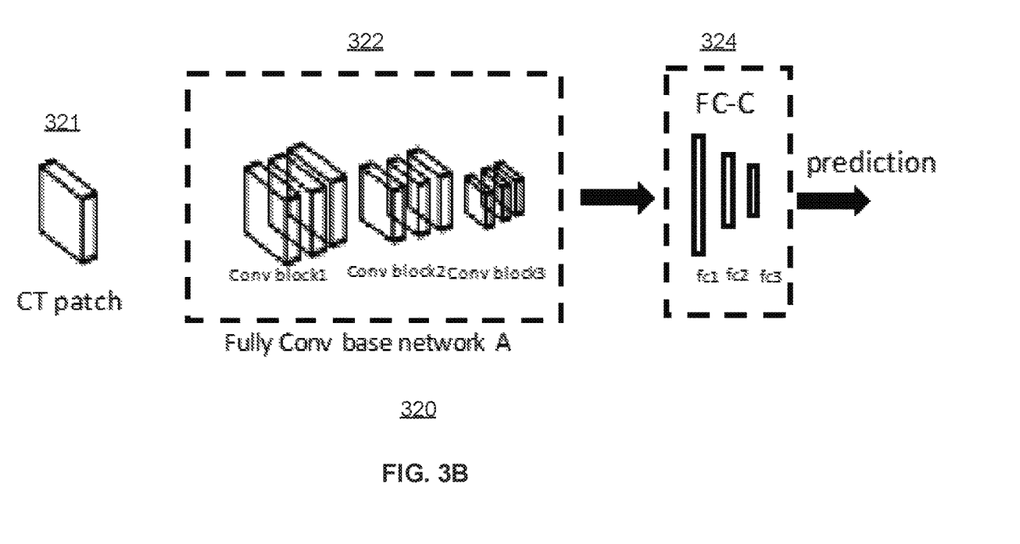
FIG. 3B illustrates an exemplary second-modality learning network for segmenting second-modality images, according to embodiments of the disclosure.

In some embodiments, as shown by FIG. 3B, the first-modality learning network may be a CT segmentation network 320, which includes, among others, a fully convolutional base network A 322, and a fully connected network FC-C 324. CT segmentation network 320 receives CT image patches 321 as its input and outputs predication/segmentation results, e.g., labels for the pixels/voxels of CT image patches 321. FC-C 324 further includes multiple fully connected layers, such as fc1, fc2, and fc3.

Figure 4:
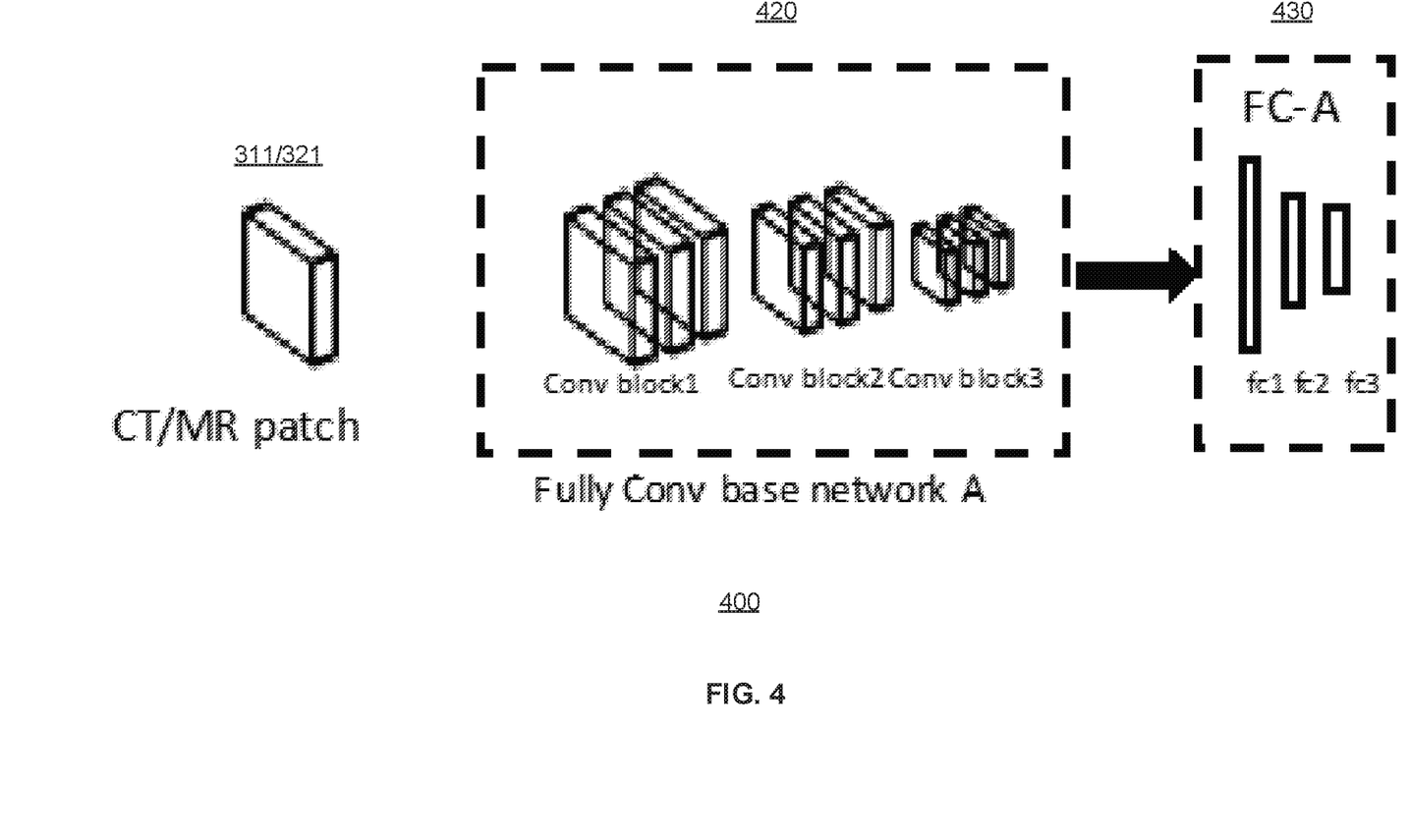
FIG. 4 illustrates an exemplary cross-modality learning network for learning image features from first and second modality images, according to embodiments of the disclosure.

FIG. 4 illustrates an exemplary cross-modality learning network 400 for learning image features from first and second modality images, according to embodiments of the disclosure. In some embodiments, cross-modality learning network 400 includes, among others, a fully convolutional base network A 420, and a fully connected network FC-A 430. Cross-modality learning network 400 receives MRI image patches 311 and CT image patches 321 as its input and output image features learned from the multi-modality images. FC-A 430 further includes multiple fully connected layers, such as fc1, fc2, and fc3, for learning the image features from MRI image patches 311 and CT image patches 321.

Consistent with the present disclosure, fully convolutional base network A 312, 322, and 420 are the same base network shared by MRI segmentation network 310, CT segmentation network 320, and cross-modality learning network 400. In some embodiments, MRI segmentation network 310, CT segmentation network 320, and cross-modality learning network 400 are jointly trained by model training device 102. For example, the training uses a loss function that takes into account outputs from all three networks, e.g., outputs from FC-A 430, FC-B 314, and FC-C 324. As a result, the joint training regularizes each network's learning space. The shared fully convolutional base network 312/322/420 carries information from both modalities. Therefore, even if MRI segmentation network 310 or CT segmentation network 320 is used to segment a single-modality image, the segmentation can take advantage of cross-modality information leveraged by the jointly trained network.

Image processing device 103 may receive the segmentation networks, e.g., MRI segmentation network 310 and CT segmentation network 320, from model training device 102. Image processing device 103 may include a processor and a non-transitory computer-readable medium (discussed in detail in connection with FIG. 2). The processor may perform instructions of an image segmentation process stored in the medium. Image processing device 103 may additionally include input and output interfaces (discussed in detail in connection with FIG. 2) to communicate with medical image database 104, network 106, and/or a user interface (not shown). The user interface may be used for selecting a medical image for segmentation, initiating the segmentation process, displaying the medical image and/or the segmentation results.

Image processing device 103 may communicate with medical image database 104 to receive one or more medical images. In some embodiments, the medical images stored in medical image database 104 may include medical image of multiple imaging modalities, such as MRI image and CT images. The medical images may be acquired by image acquisition devices 105, such as an MRI scanner and a CT scanner. Image processing device 103 may use the trained segmentation models received from model training device 102 to predict whether each pixel or superpixel of the medical image corresponds to an object of interest, and output a segmented image. Consistent with some embodiments, image processing device 103 may segment a single-modality image, such as an MRI image or a CT image. Image processing device 103 selects a segmentation network, from the networks received from model training device 102, based on the type of modality the medical image is. Image processing device 103 does not require that the medical image to have a corresponding image of another modality available for co-segmentation. Because the segmentation networks are jointly trained and include a fully convolutional base network that carries cross-modality information, image processing device 103 can segment a single-modality image while still taking advantage of the cross-modality information.

Figure 2:
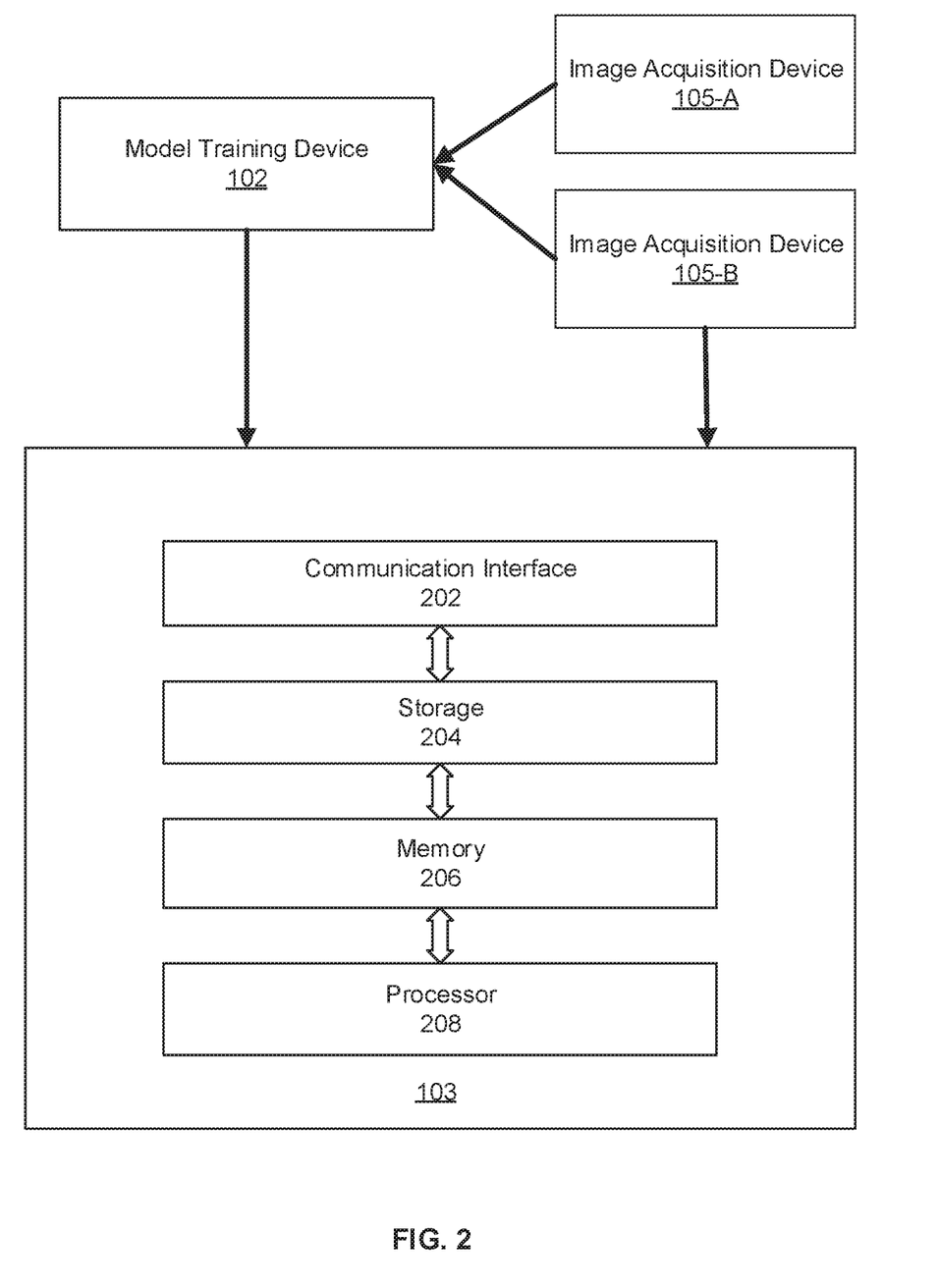
FIG. 2 illustrates a block diagram of an exemplary image processing device, according to embodiments of the disclosure.

FIG. 2 illustrates an exemplary image processing device 103, according to some embodiments of the present disclosure. In some embodiments, image processing device 103 may be a special-purpose computer, or a general-purpose computer. For example, image processing device 103 may be a computer custom-built for hospitals to perform image acquisition and image processing tasks. As shown in FIG. 2, image processing device 103 may include a communication interface 202, a storage 204, a memory 206, and a processor 208.

Communication interface 202 may include a network adaptor, a cable connector, a serial connector, a USB connector, a parallel connector, a high-speed data transmission adaptor, such as fiber, USB 3.0, thunderbolt, and the like, a wireless network adaptor, such as a WiFi adaptor, a telecommunication (3G, 4G/LTE and the like) adaptor, etc. Image processing device 103 may be connected to other components of image segmentation system 100 and network 106 through communication interface 202. In some embodiments, communication interface 202 receives medical image from image acquisition devices 105-A and 105-B. For example, image acquisition device 105-A is an MRI scanner and image acquisition device 105-B is an MRI scanner. In some embodiments, communication interface 202 also receives the segmentation networks, e.g., MRI segmentation network 310 and CT segmentation network 320, from modeling training device 102.

Storage 204/memory 206 may be a non-transitory computer-readable medium, such as a read-only memory (ROM), a random access memory (RAM), a phase-change random access memory (PRAM), a static random access memory (SRAM), a dynamic random access memory (DRAM), an electrically erasable programmable read-only memory (EEPROM), other types of random access memories (RAMs), a flash disk or other forms of flash memory, a cache, a register, a static memory, a compact disc read-only memory (CD-ROM), a digital versatile disc (DVD) or other optical storage, a cassette tape or other magnetic storage devices, or any other non-transitory medium that may be used to store information or instructions capable of being accessed by a computer device, etc.

In some embodiments, storage 204 may store the trained network(s), e.g., MRI segmentation network 310, CT segmentation network 320, and cross-modality learning network 400, and data, such as extracted image features, used or generated while executing the computer programs, etc. In some embodiments, memory 206 may store computer-executable instructions, such as one or more image processing programs. In some embodiments, a medical image stored in storage 204 may be divided into multiple image patches, each containing a subset of the medical image. The image patches may be read from storage 204 one by one and stored in memory 206.

Processor 208 may be a processing device that includes one or more general processing devices, such as a microprocessor, a central processing unit (CPU), a graphics processing unit (GPU), and the like. More specifically, the processor may be a complex instruction set computing (CISC) microprocessor, a reduced instruction set computing (RISC) microprocessor, a very long instruction word (VLIW) microprocessor, a processor running other instruction sets, or a processor that runs a combination of instruction sets. The processor may also be one or more dedicated processing devices such as application specific integrated circuits (ASICs), field programmable gate arrays (FPGAs), digital signal processors (DSPs), system-on-chip (SoCs), and the like. Processor 208 may be communicatively coupled to memory 206 and configured to execute the computer-executable instructions stored thereon.

In some embodiments, processor 208 is configured to determine the imaging modality of the medical image for segmentation. For example, if the medical image is an MRI image, processor 208 may select MRI segmentation network 310 to segment the image. Similarly, if the medical image is a CT image, processor 208 may select CT segmentation network 320 to segment the image. Segmenting the medical image includes extracting image features and applying the selected segmentation network to the image features. In some embodiments, the image features extracted may be among those learned by cross-modality learning network 400. An exemplary image segmentation process will be described in connection with FIG. 7.

Consistent with the present disclosure, model training device 102 can have same or similar structures as image processing device 103. In some embodiments, model training device 102 includes a processor, among other components, configured to jointly train MRI segmentation network 310, CT segmentation network 320, and cross-modality learning network 400 using MRI using MRI training images and CT training images. An exemplary network training process will be described in connection with FIG. 5 and FIG. 6.

Figure 5:
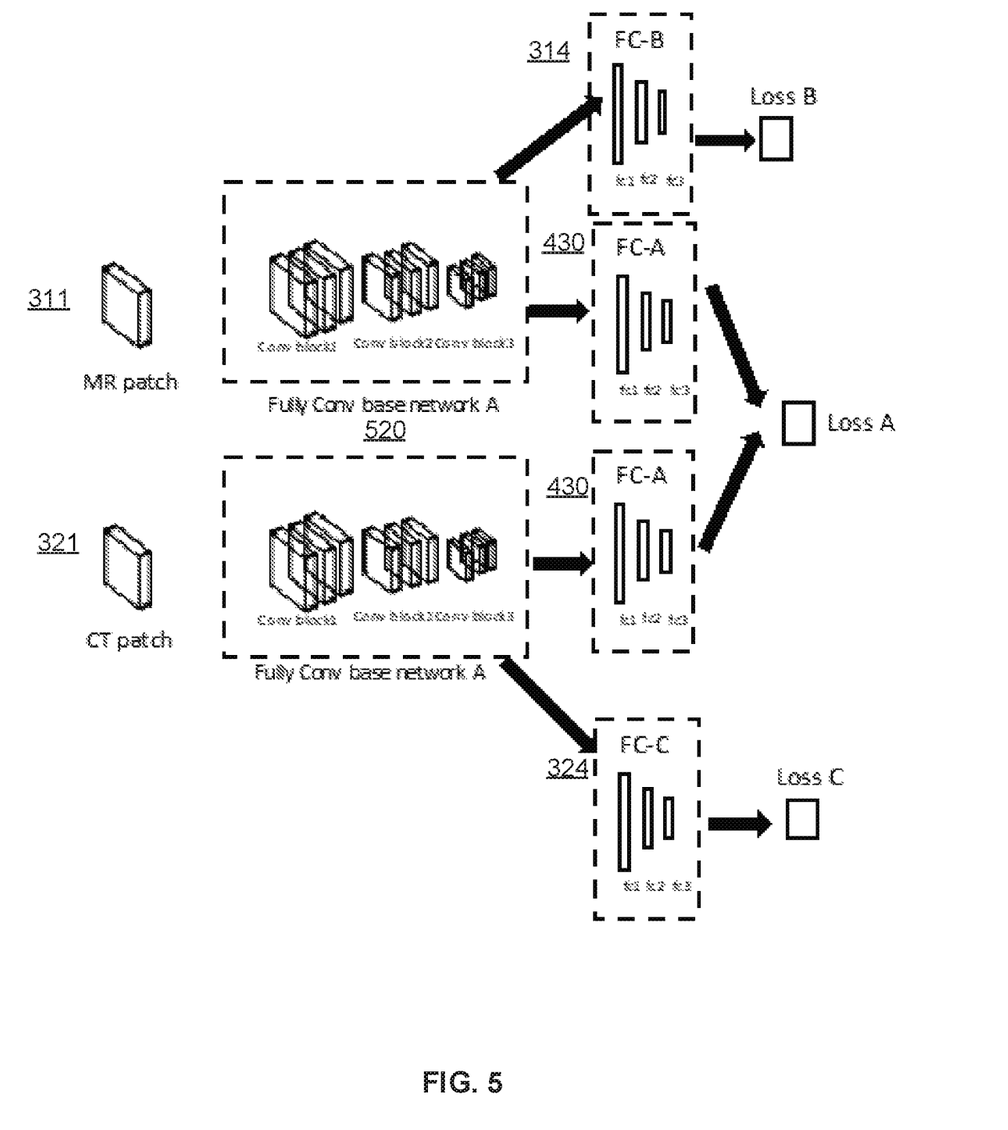
FIG. 5 illustrates the joint training of the exemplary first-modality learning network of FIG. 3A, the exemplary second-modality learning network of FIG. 3B, and the cross-modality learning network of FIG. 4, according to embodiments of the disclosure.
Figure 6:
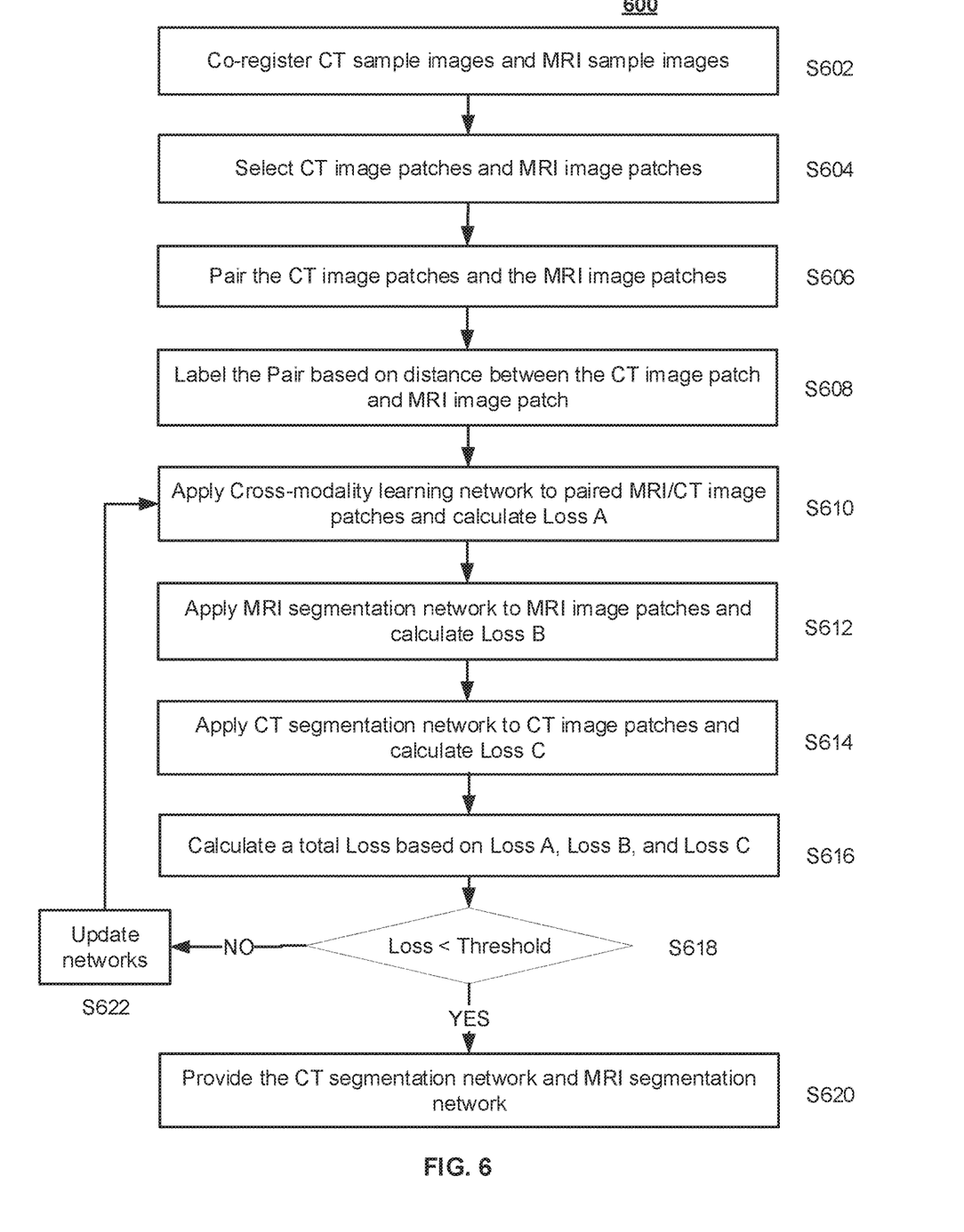
FIG. 6 shows a flow chart of an exemplary method for jointly training the learning networks, according to embodiments of the disclosure.

FIG. 5 illustrates the joint training of exemplary first-modality learning network (e.g., MRI segmentation network 310 of FIG. 3A), exemplary second-modality learning network (e.g., CT segmentation network 320 of FIG. 3B), and cross-modality learning network 400 of FIG. 4, according to embodiments of the disclosure. FIG. 6 shows a flow chart of an exemplary method 600 for jointly training the learning networks, according to embodiments of the disclosure. For example, method 600 may be implemented by model training device 102 in FIG. 1. However, method 600 is not limited to that exemplary embodiment. Method 600 may include steps S602-S622 as described below. It is to be appreciated that some of the steps may be optional to perform the disclosure provided herein. Further, some of the steps may be performed simultaneously, or in a different order than shown in FIG. 6. FIG. 5 and FIG. 6 will be described together.

In step S602, model training device 102 co-registers MRI training images and CT training images received from, e.g., training database 101. The co-registration brings correspondence between the MR pixel/voxels and the CT pixel/voxels. Various multi-modality image registration methods may be used, including, e.g., intensity-based and feature-based registrations. In some embodiments, the registration can use linear or elastic transformations.

In step S604, model training device 102 selects training image patches from both modalities. For example, MRI image patches 311 and Image patch is a subset of an image that contains multiple pixels/voxels. For example, an image of 100×100 can be divided into 100 patches of size 10×10. In some embodiments, the image patches cropped by the MRI and CT training images may be of size 32×32×32.

In step S606, the selected MRI image patches and CT image patches are paired according to the correspondence established through the co-registration. CT and MRI patches are paired as (P_B, P_C) and simultaneously fed to train the learning networks in later steps, where P_B is an MRI patch and P_C is a CT patch. In some embodiments, the paired MRI image patch and CT image patch correspond to the same or close physical location in the underlying object. In some embodiments, the paired patches may be far away from each other.

In step S608, model training device 102 labels the paired image patches. In some embodiments, two sets of labels are determined for each pair. The first set of labels indicate whether the respective patch (MRI or CT patch) contains or corresponds to an object of interest, e.g., a tumor, a blood vessel, etc. For example, the label value is 1 when the image patch corresponds to a cancer tumor area, or 0 if it is part of the background. The first set of labels therefore include two labels, each for an image patch in the pair.

In addition, in some embodiments, a second label y is determined. Unlike the first set of labels described above, y is a single label for the pair. In some embodiments, y is also binary, taking the value of positive (e.g., 1), or negative (e.g., 0). For example, y is positive when image patches P_B and P_C are selected from the same or close physical positions. y is negative when image patches P_B and P_C are selected from different (far) positions. In some embodiments, close-far distance can be determined by Euclidean distance threshold ($\theta_1$ and $\theta_2$). Label y can be determined according to Equation (1) below:

$$y = \begin{cases} 1, & dist < \theta_1 \\ 0, & dist > \theta_2 \end{cases}, \quad (1)$$

where dist is Euclidean distance between two patches. $\theta_1$ and $\theta_2$ are two distance thresholds ($\theta_1 < \theta_2$). Accordingly, each image patch is associated with two labels: (1) object or background, and (2) near or far.

In steps S610-622, model training device 102 jointly trains cross-modality learning network 400, MRI segmentation network 310 and CT segmentation network 320, using paired MRI/CT image patches 311/321. As shown in FIG. 5, the training involves a fully convolution base network A 520, shared by cross-modality learning network 400, MRI segmentation network 310 and CT segmentation network 320, and fully connected networks FC-A 430, FC-B 314, and FC-C 324. Consistent with the present disclosure, the joint training uses a total loss that consists of Loss A calculated using outputs from FC-A 430, Loss B calculated using outputs from FC-B 314, and Loss C calculated using outputs from FC-C 324. FC-A 430 is an auxiliary sub-network for learning image features, that will be later removed from the segmentation networks (e.g., 310 and 320). The joint training includes three aspects: (1) MR image patch classification, (2) CT image patch classification, and (3) image feature learning. The multi-tasks regularize each network's learning space. As shown in FIG. 5, the three networks jointly trained share same fully convolution base network 520, and therefore, each trained learning network is encoded with information from both modalities.

In step S610, model training device 102 applies cross-modality learning network 400 to paired MRI/CT image patches and calculates a Loss A. As shown in FIG. 5, MRI/CT image patches 311/321 are input to fully convolutional base network 520, and then to FC-A 430. Loss A can be calculated based on the outputs of FC-A 430. In some embodiments, Loss A is a contrastive loss. For example, Loss A can be calculated according to Equation (2).

$$Loss_A = \frac{1}{2N} \sum_{n=1}^{N} (y)d^2\mathcal{X} + (1-y)[\max(\text{margin} - d, 0)]^2 \quad (2)$$

where y is pair-wise label, $d=\|a_n - b_n\|$ is distance of two patches in the feature space. $a_n$ is feature vector (FC-A output) for MRI image patch 311 and $b_n$ is feature vector (FC-A output) for CT image patch 321.

Using a contrastive loss, FC-A 430 will learn the manifold of that features are close in the feature space if two patches are close in the physical space but are far if two patches are far in the physical space. Accordingly, the trained networks are forced to learn the common features from the different modalities, e.g., CT and MRI. If one of the modalities does not exist, the trained networks are still able to leverage the information from learned cross-modality information which is encoded in base network 520.

In step S612, model training device 102 applies MRI segmentation network 310 to MRI image patches and calculates a Loss B. Similarly, in step S614, model training device 102 applies CT segmentation network 320 to CT image patches and calculates a Loss C. In some embodiments, MRI segmentation network 310 and CT segmentation network 320 are classification networks. As shown in FIG. 5, MRI image patches 311 are input to fully convolutional base network 520, and then to FC-B 314. Similarly, CT image patches 321 are input to fully convolutional base network 520, and then to FC-C 324. Loss B and Loss C can be calculated based on the outputs of FC-B 314 and FC-C 324, respectively. In some embodiments, Loss B or Loss B 324 is a cross-entropy loss. For example, Loss B or Loss C can be calculated according to Equation (3):

$$Loss_{B \text{ or } C} = \frac{-1}{N} \sum_{n=1}^{N} [p_n \log \hat{p}_n + (1 - p_n)\log(1 - \hat{p}_n)] \quad (3)$$

where N is the number of samples. $p_n$ is ground truth probability of the sample belonging to the object of interest. $\hat{p}_n$ is the prediction that the sample belonging to the object of interest.

In step S616, model training device 102 calculates a total Loss based on Loss A, Loss B, and Loss C. In some embodiments, the total Loss may be a weighted sum of Loss A, Loss B, and Loss C. For example, Loss can be calculated according to Equation (4):

$$Loss = aLoss_A + bLoss_B + cLoss_C \quad (4)$$

where a, b, c are weighting parameters for three loss and they satisfy a+b+c=1. Loss A, Loss B, and Loss C can be combined in other suitable ways to derive Loss. Because Loss contains information of both modalities, the three networks jointly trained to minimize the Loss are also encoded with the cross-modality information.

In step S618, the calculated Loss is compared with a predetermined threshold. If the Loss is smaller than the threshold (S618: yes), method 600 proceeds to step S620 to provide the jointly trained networks, including e.g., MRI segmentation network 310 and CT segmentation network 320, to image processing device 103. Otherwise, method proceeds to step S622 to further update the networks in a way to reduce the Loss. In some embodiments, stochastic gradient descent is used as the optimizer to reduce the loss and train the model.

Figure 7:
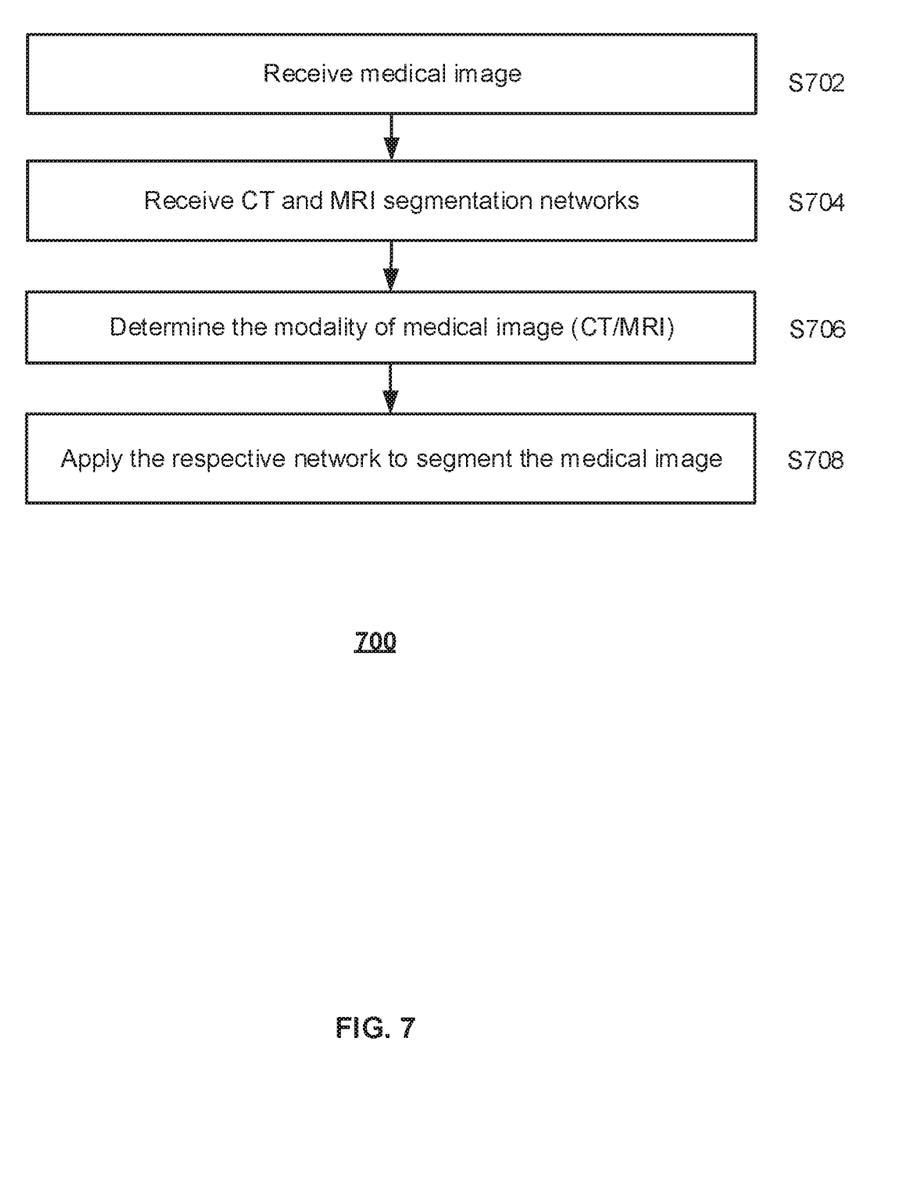
FIG. 7 shows a flow chart of an exemplary method for segmenting a medical image, according to embodiments of the disclosure.

FIG. 7 shows a flow chart of an exemplary method 700 for segmenting a medical image, according to embodiments of the disclosure. For example, method 700 may be implemented by image processing device 103 in FIG. 1. However, method 700 is not limited to that exemplary embodiment. Method 700 may include steps S602-S708 as described below. It is to be appreciated that some of the steps may be optional to perform the disclosure provided herein. Further, some of the steps may be performed simultaneously, or in a different order than shown in FIG. 7.

In step S702, image processing device 103 receives a medical image, e.g., from medical image database 104. The medical image can be of any imaging modality, such as MRI or CT. In step S704, image processing device 103 receives segmentation networks, e.g., MRI segmentation network 310 and CT segmentation network 320. For example, the segmentation networks may be trained using method 600.

In step S706, image processing device 103 determines the imaging modality of the medical image. In some embodiments, the image modality of the medical image may be identified by the header of the image data file. In step S708, image processing device 103 selects the respective segmentation network based on the imaging modality of the medical image and applies the segmentation network to segment the medical image. For example, MRI segmentation network 310 is applied to segment an MRI image.

In some embodiments, as part of S708, a sliding window can be applied to the target image. Accordingly, each scanned pixel/voxel obtains either foreground or background label based on the segmentation network output, and a segmentation mask is obtained for the target image. In some embodiments, fully connected layers (FC-B and FC-C in FIG. 3A and FIG. 3B) of the MRI segmentation network 310 and CT segmentation network 320 may be converted into fully convolution layers, as described in U.S. application Ser. No. 16/049,809. The converted fully convolution network is applied to the whole image to obtain the segmentation mask. In some embodiments, due to used maxpooling, the mask size is reduced comparing to original input image size.

Although in the disclosed embodiments, FC-A 430 (shown in FIG. 5) is used as an auxiliary network to regularize training the classification networks, the features produced from FC-A 430 could be utilized in various other applications without departing from the scope and spirit of the present disclosure. In one embodiment, the produced feature vector (fc3) is used to replace conventional feature descriptors (e.g. 3D SIFT) in image matching problem. For example, to determine if an MRI image patch and a CT image patch are from the same location in the physical space, an image descriptor such as a Scale-Invariant Feature Transform (SIFT) descriptor can be defined for each patch. Gray-level and gradient patterns are significantly different from two modalities (e.g. CT and MRI). SIFT descriptors are computed based on gradient, so that they are not sufficient to indicate similarity and dissimilarity between image patches across different modalities. In some embodiments, the disclosed systems and methods can directly learn image patch representation from data, by targeting at understanding similarity and dissimilarity using contrastive loss and designed training method such as method 600.

In some other embodiments, the learned features by FC-A 430 can be applied to a feature-based image registration framework, which transfers either CT image coordinates to MR image coordinates or transfers MR image coordinates to CT coordinates. For example, the learned features can be feedback to improve the co-registration of MRI image and CT image in step S602. In some embodiments, for dense feature-based registration method, patches can be extracted around each voxel to produce patch feature describing the voxels. For sparse feature-based method, patches are extracted around key points the produce patch feature describing the key points. If two patches (e.g., one from CT and one from MR) have similar descriptors, these two patches are considered corresponding to each other. Knowing the correspondence between a number of points in images, a geometrical transformation can be computed for aligning the two images.

Another aspect of the disclosure is directed to a non-transitory computer-readable medium storing instructions which, when executed, cause one or more processors to perform the methods, as discussed above. The computer-readable medium may include volatile or non-volatile, magnetic, semiconductor, tape, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

What is claimed is:

1. A system for segmenting a medical image, comprising:
a communication interface configured to receive the medical image acquired by an image acquisition device;
a memory configured to store a plurality of learning networks jointly trained using first training images of a first imaging modality and second training images of a second imaging modality,
wherein the plurality of learning networks are jointly trained with a cross-modality learning network using a loss function constructed using outputs by the cross-modality learning network and the plurality of learning networks; and
a processor, configured to segment the medical image using a segmentation network selected from the plurality of learning networks.

2. The system of claim 1, wherein the learning network is a convolutional neural network.

3. The system of claim 1, wherein the first imaging modality and the second imaging modality are selected from a group of Computed Tomography (CT), magnetic resonance imaging (MRI), functional MRI, cone beam computed tomography (CBCT), positron emission tomography (PET), single-photon emission computed tomography (SPECT), X-ray, optical tomography, fluorescence imaging, ultrasound imaging, and radiotherapy portal imaging.

4. The system of claim 1, wherein the communication interface is further configured to receive the plurality of learning networks from a training device, wherein the plurality of learning networks include a first-modality learning network and a second-modality learning network, wherein the training device is configured to jointly train the cross-modality learning network, the first-modality learning network, and the second-modality learning network,
wherein the cross-modality learning network includes a convolutional base network, and an auxiliary network for learning image features from the first training images and second training images, wherein the first-modality learning network includes the convolutional base network, and a first classification network for segmenting the first training images, and wherein the second-modality learning network includes the convolutional base network, and a second classification network for segmenting the second training images.

5. The system of claim 4, wherein the processor is further configured to:

determine that the medical image is of the first imaging modality; and select the first-modality learning network as the segmentation network for segmenting the medical image.

6. The system of claim 4, wherein the training device is further configured to:

register the first training images with the second training images;

select first image patches from first training images and second image patches from the second training images;

pair the first image patches with the second image patches based on the registration; and jointly train the cross-modality learning network, the first-modality learning network, and the second-modality learning network using the paired image patches.

7. The system of claim 6, wherein the training device is further configured to determine a label for each pair of first image patch and second image patch, the label indicating a distance between physical positions of the first image patch and the second image patch of the pair.

8. The system of claim 6, wherein the training device is further configured to apply the image features learned by an auxiliary network to register the first training images with the second training images.

9. The system of claim 4, wherein to jointly train the networks, the training device is configured to use the loss function, wherein the loss function is constructed using outputs by the cross-modality learning network, the first-modality learning network, and the second-modality learning network.

10. A method for segmenting a medical image, comprising:

receiving the medical image acquired by an image acquisition device;

receiving, from a training device, a plurality of learning networks jointly trained using first training images of a first imaging modality and second training images of a second imaging modality, wherein the plurality of learning networks are jointly trained with a cross-modality learning network using a loss function constructed using outputs by the cross-modality learning network and the plurality of learning networks; and segmenting, by a processor, the medical image using a segmentation network selected from the plurality of learning networks.

11. The method of claim 10, wherein the learning network is a convolutional neural network.

12. The method of claim 10, wherein the first imaging modality and the second imaging modality are selected from a group of Computed Tomography (CT), magnetic resonance imaging (MRI), functional MRI, cone beam computed tomography (CBCT), positron emission tomography (PET), single-photon emission computed tomography (SPECT), X-ray, optical tomography, fluorescence imaging, ultrasound imaging, and radiotherapy portal imaging.

13. The method of claim 10, wherein the plurality of learning networks include a first-modality learning network and a second-modality learning network, wherein the method further comprises jointly training the cross-modality learning network, the first-modality learning network, and the second-modality learning network, wherein the cross-modality learning network includes a convolutional base network, and an auxiliary network for learning image features from the first training images and second training images, wherein the first-modality learning network includes the convolutional base network, and a first classification network for segmenting the first training images, and wherein the second-modality learning network includes the convolutional base network, and a second classification network for segmenting the second training images.

14. The method of claim 13, further comprising:

determining that the medical image is of the first imaging modality; and selecting the first-modality learning network as the segmentation network for segmenting the medical image.

15. The method of claim 13, wherein jointly training the networks further comprises:

registering the first training images with the second training images;

selecting first image patches from first training images and second image patches from the second training images;

pairing the first image patches with the second image patches based on the registration; and jointly training the cross-modality learning network, the first-modality learning network, and the second-modality learning network using the paired image patches.

16. The method of claim 15, wherein jointly training the networks further comprises determining a label for each pair of first image patch and second image patch, the label indicating a distance between physical positions of the first image patch and the second image patch of the pair.

17. The system of claim 15, wherein registering the first training images with the second training images further comprises applying the image features learned by an auxiliary network to improve the registration.

18. The method of claim 13, wherein jointly training the networks further comprises using the loss function, wherein the loss function is constructed using outputs by the cross-modality learning network, the first-modality learning network, and the second-modality learning network.

19. A non-transitory computer-readable medium having a computer program stored thereon, wherein the computer program, when executed by at least one processor, performs a method for segmenting a medical image, the method comprising:

receiving the medical image acquired by an image acquisition device;

receiving a plurality of learning networks jointly trained using first training images of a first imaging modality and second training images of a second imaging modality, wherein the plurality of learning networks are jointly trained with a cross-modality learning network using a loss function constructed using outputs by the cross-modality learning network and the plurality of learning networks; and segmenting the medical image using a segmentation network selected from the plurality of learning networks.

20. The non-transitory computer-readable medium of claim 19, wherein the plurality of learning networks include a first-modality learning network and a second-modality learning network, wherein the method further comprises jointly training the cross-modality learning network, the first-modality learning network, and the second-modality learning network,     wherein the cross-modality learning network includes a convolutional base network, and an auxiliary network for learning image features from the first training images and second training images,     wherein the first-modality learning network includes the convolutional base network, and a first classification network for segmenting the first training images, and     wherein the second-modality learning network includes the convolutional base network, and a first classification network for segmenting the second training images.

* * * * *